US012706593B2

(12) United States Patent
Du et al.

(10) Patent No.: US 12,706,593 B2
(45) Date of Patent: Aug. 11, 2026

(54) OUTPUT DRIVING CIRCUIT, CLOCK CHIP, AND ELECTRONIC DEVICE

(71) Applicant: Montage Electronics (Shanghai) Co., Ltd., Shanghai (CN)

(72) Inventors: Juan Du, Shanghai (CN); Chunlai Sun, Shanghai (CN); Yuchen Tian, Shanghai (CN)

(73) Assignee: Montage Electronics (Shanghai) Co., Ltd., Shanghai (CN)

( * ) Notice: Subject to any disclaimer, the term of this patent is extended or adjusted under 35 U.S.C. 154(b) by 0 days.

(21) Appl. No.: 18/648,472

(22) Filed: Apr. 28, 2024

(65) Prior Publication Data

US 2024/0429903 A1 Dec. 26, 2024

(30) Foreign Application Priority Data

Jun. 21, 2023 (CN) ........................ 202310753113.8

(51) Int. Cl.

| | |
|---|---|
| ***H03K 3/00*** | (2006.01) |
| ***H03K 3/012*** | (2006.01) |
| ***H03K 3/037*** | (2006.01) |
| ***H03K 3/356*** | (2006.01) |
| ***H03K 19/0185*** | (2006.01) |

(52) U.S. Cl.

CPC ............ *H03K 3/037* (2013.01); *H03K 3/012* (2013.01); *H03K 3/35613* (2013.01); *H03K 19/018521* (2013.01)

(58) Field of Classification Search

CPC ........ H03F 3/45; H03K 5/2418; H03K 5/227; H03K 19/018521; G11C 7/062

See application file for complete search history.

(56) References Cited

U.S. PATENT DOCUMENTS

| | | | | |
|---|---|---|---|---|
| 1,152,919 | A * | 9/1915 | Schueler | B30B 9/042 74/439 |
| 6,617,925 | B2 * | 9/2003 | Hoang | H03K 19/018528 330/253 |
| 8,803,609 | B2 * | 8/2014 | Kao | H03F 3/45246 330/253 |
| 9,391,602 | B1 * | 7/2016 | Kasanyal | H03K 19/018528 |
| 11,223,359 | B2 * | 1/2022 | Nadkarni | G06F 1/3296 |
| 2011/0128036 | A1 * | 6/2011 | Liu | H03K 19/018571 326/83 |

(Continued)

*Primary Examiner* — Tuan T Lam

(74) *Attorney, Agent, or Firm* — IPRTOP LLC

(57) ABSTRACT

An output driving circuit, a clock chip, and an electronic device are provided. The output driving circuit includes a low-voltage push-pull module and an output isolation module, wherein the low-voltage push-pull module is connected to a low-voltage bias voltage and is configured to receive and process a high-speed input signal, and to output an intermediate signal having a target level, wherein the low-voltage push-pull module includes one or more push-pull units, each including a low-voltage transistor pair, wherein the output isolation module is connected between an output terminal of the low-voltage push-pull module and an output terminal of the output driving circuit, wherein the output isolation module is configured to be turned on when the output driving circuit works normally, and to output the intermediate signal as a target output signal of the output driving circuit. The output driving circuit has lower power consumption.

17 Claims, 5 Drawing Sheets

(56) References Cited

U.S. PATENT DOCUMENTS

| | | | | |
|---|---|---|---|---|
| 2011/0267900 | A1* | 11/2011 | Kim | G11C 29/028 365/189.11 |
| 2014/0002197 | A1* | 1/2014 | Patasani | H03L 7/02 331/34 |
| 2020/0358409 | A1* | 11/2020 | Lee | H03F 3/45237 |
| 2023/0231551 | A1* | 7/2023 | Lee | H03K 19/018521 327/551 |

* cited by examiner

OUTPUT DRIVING CIRCUIT, CLOCK CHIP, AND ELECTRONIC DEVICE

CROSS REFERENCE TO RELATED APPLICATION

The present application claims the benefit of priority to Chinese Patent Application No. CN 2023107531138, entitled "OUTPUT DRIVING CIRCUIT, CLOCK CHIP, AND ELECTRONIC DEVICE", filed with CNIPA on Jun. 21, 2023, the disclosure of which is incorporated herein by reference in its entirety.

FIELD OF TECHNOLOGY

The present disclosure relates to the technical field of electronic circuits and relates to a driving circuit, in particular to an output driving circuit, a clock chip and an electronic device.

BACKGROUND

High-speed current-mode logic (HCSL) is a high-speed differential signal transmission standard, which is mainly applied to the field of high-speed data transmission and communication, such as high-speed buses, network switches, and routers. Compared with conventional voltage transmission standards, such as Low Voltage Differential Signaling (LVDS) and Differential Current-Mode Logic (CML), the HCSL standard has a lower power consumption, smaller noise, higher transmission rate, and farther transmission distance.

HCSL output driving circuits are an important part of the HCSL standard and have a high-speed electrical signal driving capability. HCSL output driving circuits can convert an input signal into a current signal and output the current signal, thereby realizing high-speed data transmission. HCSL output driving circuits are commonly used in drivers and transceivers of high-speed digital circuits such as data transmission circuits, memory devices, and processors. However, existing HCSL output driving circuits generally have a problem with excessive power consumption.

SUMMARY

The present disclosure provides an output driving circuit, a clock chip, and an electronic device, for solving the problem of excessive power consumption of HCSL output driving circuits.

In a first aspect, the present disclosure provides an output driving circuit. The output driving circuit includes a low-voltage push-pull module and an output isolation module, wherein the low-voltage push-pull module is connected to a low-voltage bias voltage and is configured to receive and process a high-speed input signal, and to output an intermediate signal having a target level, wherein the low-voltage push-pull module includes one or more push-pull units, each including a low-voltage transistor pair, wherein the output isolation module is connected between an output terminal of the low-voltage push-pull module and an output terminal of the output driving circuit, wherein the output isolation module is configured to be turned on when the output driving circuit works normally, and to output the intermediate signal as a target output signal of the output driving circuit.

In an embodiment of the first aspect, the low-voltage push-pull module includes two push-pull units, and the two push-pull units receive a pair of differential signals.

In an embodiment of the first aspect, each of the push-pull units includes a first low-voltage transistor and a second low-voltage transistor with opposite polarities, and the first low-voltage transistor and the second low-voltage transistor are connected in series between the low-voltage bias voltage and ground.

In an embodiment of the first aspect, the first low-voltage transistor is a low-voltage PMOS transistor, and the second low-voltage transistor is a low-voltage NMOS transistor.

In an embodiment of the first aspect, a source of the first low-voltage transistor is connected to the low-voltage bias voltage, a drain of the first low-voltage transistor is connected to a drain of the second low-voltage transistor, a source of the second low-voltage transistor is connected to ground, a gate of the first low-voltage transistor is connected to a gate of the second low-voltage transistor, a connection point between the gate of the first low-voltage transistor and the gate of the second low-voltage transistor is configured as an input terminal of the corresponding push-pull unit, and a connection point between the drain of the first low-voltage transistor and the drain of the second low-voltage transistor is configured as the output terminal of the corresponding push-pull unit.

In an embodiment of the first aspect, the output isolation module includes output isolation units in one-to-one correspondence with the one or more push-pull units, and each of the output isolation units includes a first high-voltage transistor, wherein: a drain of the first high-voltage transistor is connected to an output terminal of a corresponding push-pull unit and is configured to receive the intermediate signal; a gate of the first high-voltage transistor receives a control voltage, wherein the control voltage turns on or off the first high-voltage transistor; a source of the first high-voltage transistor is connected to the output terminal of the output driving circuit, wherein the intermediate signal is output as the target output signal via the output terminal of the output driving circuit when the first high-voltage transistor is turned on.

In an embodiment of the first aspect, the first high-voltage transistor is a native NMOS transistor.

In an embodiment of the first aspect, the output driving circuit further includes an impedance calibration module, and the impedance calibration module is configured to calibrate an output impedance of the output driving circuit, so that the output impedance of the output driving circuit is substantially constant.

In an embodiment of the first aspect, the impedance calibration module includes: a reference voltage generating circuit configured to generate a reference voltage; a calibration voltage generating circuit configured to generate a calibration voltage, wherein the calibration voltage is negatively correlated with the output impedance of the output driving circuit; and an impedance calibration circuit configured to adjust the control voltage according to the reference voltage and the calibration voltage.

In an embodiment of the first aspect, the reference voltage generating circuit includes a first resistor and a second resistor, the first resistor and the second resistor are connected in series between the low-voltage bias voltage and ground, and a connection point between the first resistor and the second resistor is configured as an output terminal of the reference voltage generating circuit to output the reference voltage.

In an embodiment of the first aspect, the first resistor and the second resistor have substantially the same resistance.

In an embodiment of the first aspect, the calibration voltage generating circuit includes a third low-voltage transistor, a second high-voltage transistor, and a third resistor, wherein the third low-voltage transistor, the second high-voltage transistor and the third resistor are connected in series between the low-voltage bias voltage and ground, a connection point between the second high-voltage transistor and the third resistor is configured as an output terminal of the calibration voltage generating circuit to output the calibration voltage, and the second high-voltage transistor receives the control voltage output by the impedance calibration circuit, wherein the third low-voltage transistor and the first low-voltage transistor are transistors of the same type, the second high-voltage transistor and the first high-voltage transistor are transistors of the same type, an overall size of the third low-voltage transistor and the second high-voltage transistor is 1/N of that of the first low-voltage transistor and the first high-voltage transistor, and a ratio of a resistance of the third resistor to N is the target output impedance of the output driving circuit.

In an embodiment of the first aspect, the third low-voltage transistor is a low-voltage PMOS transistor, and the second high-voltage transistor is a high-voltage native NMOS transistor.

In an embodiment of the first aspect, a source of the third low-voltage transistor is connected to the low-voltage bias voltage, a drain of the third low-voltage transistor is connected to a drain of the second high-voltage transistor, a gate of the third low-voltage transistor is connected to ground, a source of the second high-voltage transistor is connected to a first end of the third resistor, a second end of the third resistor is connected to ground, a gate of the second high-voltage transistor receives the control voltage output by the impedance calibration circuit, and a connection point between the source of the second high-voltage transistor and the first end of the third resistor is configured as the output terminal of the calibration voltage generating circuit to output the calibration voltage.

In an embodiment of the first aspect, the impedance calibration circuit includes an operational amplifier, a positive input terminal of the operational amplifier is configured to receive the reference voltage, a negative input terminal of the operational amplifier is configured to receive the calibration voltage, and the operational amplifier outputs the control voltage based on the reference voltage and the calibration voltage.

In an embodiment of the first aspect, the output driving circuit further includes a voltage regulator, and the voltage regulator is configured to buck a power supply voltage to output the low-voltage bias voltage.

In an embodiment of the first aspect, the output driving circuit further includes one or more pre-driving modules, and each of the pre-driving modules is connected to a corresponding input terminal of the low-voltage push-pull module to pre-drive the high-speed input signal, wherein a working voltage of the pre-driving module is the low-voltage bias voltage.

In an embodiment of the first aspect, the low-voltage bias voltage is about 0.75 V.

In a second aspect, the present disclosure provides a clock chip. The clock chip includes a clock signal generating circuit configured to generate a high-speed clock signal; and an output driving circuit, including a low-voltage push-pull module and an output isolation module, wherein the output driving circuit is configured to input the high-speed clock signal and output a target high-speed clock signal, wherein the low-voltage push-pull module is connected to a low-voltage bias voltage and is configured to receive and process the high-speed clock signal, and to output an intermediate signal having a target level, wherein the low-voltage push-pull module includes one or more push-pull units, each including a low-voltage transistor pair, wherein the output isolation module is connected between an output terminal of the low-voltage push-pull module and an output terminal of the output driving circuit, wherein the output isolation module is configured to be turned on when the output driving circuit works normally, and to output the intermediate signal as the target high-speed clock signal.

In a third aspect, the present disclosure provides an electronic device. The electronic device includes a signal generating circuit configured to generate a high-speed signal; and an output driving circuit, including a low-voltage push-pull module and an output isolation module, wherein the output driving circuit is configured to input the high-speed signal and output a target high-speed signal, wherein the low-voltage push-pull module is connected to a low-voltage bias voltage and is configured to receive and process the high-speed signal, and to output an intermediate signal having a target level, wherein the low-voltage push-pull module includes one or more push-pull units, each including a low-voltage transistor pair, wherein the output isolation module is connected between an output terminal of the low-voltage push-pull module and an output terminal of the output driving circuit, wherein the output isolation module is configured to be turned on when the output driving circuit works normally, and to output the intermediate signal as the target high-speed signal.

The output driving circuit provided in the embodiment of the present disclosure adopts an output structure with a push-pull voltage-mode, and provides a desired swing level to a receiving circuit without a termination resistor, thereby reducing output dynamic power consumption. In addition, the output driving circuit adopts an output structure with a push-pull voltage-mode composed of low-voltage transistors, which provides a faster output signal slew rate and is suitable for higher-speed application scenarios. Furthermore, low-voltage transistors have a smaller size and parasitic capacitance. Compared with the technical solution that adopts high-voltage transistors as switching transistors, the output driving circuit provided in the embodiment of the present disclosure has lower switching capacitor power consumption and parasitic power consumption.

In some embodiments of the present disclosure, pre-driving circuits of low-voltage transistors can be implemented by using a low-voltage control circuit, which is beneficial to further reducing the overall dynamic power consumption of the output driving circuit.

In some embodiments of the present disclosure, the output driving circuit further includes an adaptive impedance calibration module. The adaptive impedance calibration module adopts high-voltage native N-Type Metal Oxide Semiconductor (NMOS) transistors as output isolation devices, which can not only effectively protect low-voltage transistors and avoid reliability problems, but also ensure that the output impedance of the output driving circuit is constant, thereby ensuring that the output signal has better signal integrity in high-speed application scenarios.

DETAILED DESCRIPTION

The embodiments of the present disclosure will be described below through specific examples. Those skilled can easily understand other advantages and effects of the present disclosure from the disclosure of the present specification. The present disclosure can also be implemented or applied through other different specific embodiments. Various details in this specification can also be modified or changed based on different viewpoints and disclosures without departing from the spirit of the present disclosure. It should be noted that the following embodiments and features of the following embodiments can be combined with each other if no conflict will result.

It should be noted that the drawings provided in this disclosure only illustrate the basic concept of the present disclosure in a schematic way, so the drawings only show the components closely related to the present disclosure. The drawings are not necessarily drawn according to the number, shape and size of the components in actual implementation; during the actual implementation, the type, quantity and proportion of each component can be changed as needed, and the layout of the components can also be more complicated.

HCSL output driving circuits are an important part of HCSL and are configured to provide a high-speed electrical signal driving capability. HCSL output driving circuits can convert an input signal into a current signal and output the current signal, thereby realizing high-speed data transmission. HCSL output driving circuits are commonly applied in drivers and transceivers of high-speed digital circuits such as a data transmission, a memory, and a processor.

Figure 1:
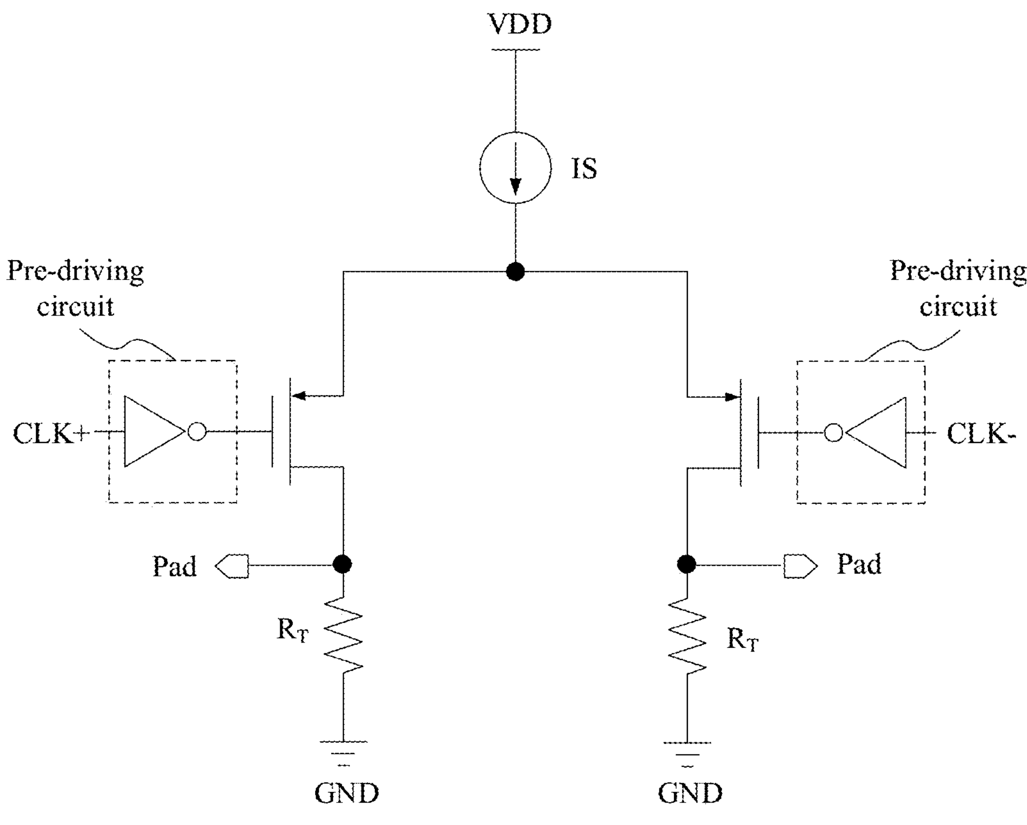
FIG. 1 shows a circuit diagram of an HCSL output driving circuit.

FIG. 1 shows a circuit diagram of an HCSL output driving circuit in some technical solutions. As shown in FIG. 1, in these technical solutions, the HCSL output driving circuit includes a current source Is output from a power supply VDD and a pair of differential high-voltage P-Type Metal Oxide Semiconductor (PMOS) switching transistors. The differential high-voltage PMOS switching transistors include one or more pre-driving circuits, each of which includes a high-voltage logic circuit operating under VDD, and output pins (PADs) of the HCSL output driving circuit are connected to ground (GND) through a corresponding termination resistor RT at the outside, thereby providing a desired swing level for a receiving circuit.

However, in the HCSL output driving circuit as shown in FIG. 1, when outputting differential signals, of the two differential high-voltage PMOS switching transistors there is always one turned on. Therefore, for output driving circuits with such a current-mode structure, the current output by their current source Is is constantly consumed by the termination resistor RT. When a voltage provided by the power supply VDD is 3.3 V, the current output by the current source Is is 15 mA, and the termination resistor RT has a resistance value of 50 ohms, the power consumption of the HCSL output driving circuit shown in FIG. 1 is about 50 mW. In addition, a slew rate between a rising edge and a falling edge of the HCSL output driving circuit shown in FIG. 1 is determined by the termination resistor RT and a load capacitor, so the slew rate isn't influenced by the HCSL output driving circuit. Therefore, when the HCSL output driving circuit is transmitting a high-speed clock signal and driving a printed circuit board (PCB) with long traces, the high-speed clock signal as output by the circuit has a poor integrity.

Figure 2:
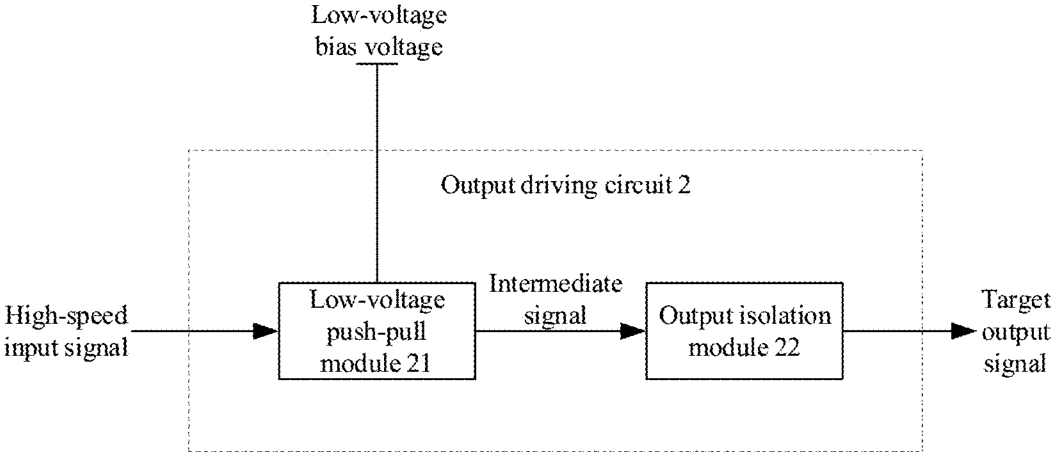
FIG. 2 shows a schematic structural diagram of an output driving circuit according to an embodiment of the present disclosure.

To solve the above-mentioned problems, the present disclosure provides an output driving circuit. FIG. 2 shows a schematic structural diagram of an output driving circuit 2 according to an embodiment of the present disclosure. As shown in FIG. 2, the output driving circuit 2 includes a low-voltage push-pull module 21 and an output isolation module 22.

The low-voltage push-pull module 21 is connected to a low-voltage bias voltage, and the low-voltage bias voltage is, for example, 0.75 V. In some embodiments, the low-voltage bias voltage may be a voltage (e.g., 0.75 V) obtained by adjusting a power supply voltage (e.g., 3.3 V) through a low drop-out (LDO) voltage regulator. In other embodiments, the low-voltage bias voltage may also be provided by an external power supply (e.g., a 0.75-V power supply).

The low-voltage push-pull module 21 includes one or more push-pull units, each including a low-voltage (LV) transistor pair. Each of the push-pull units is configured to receive a high-speed input signal and output an intermediate signal having a target level. In some embodiments, the high-speed input signal is a high-speed clock signal.

The low-voltage transistor refers to a transistor that requires a lower voltage when operating in a logic circuit. For example, in some embodiments, a working voltage of the low-voltage transistor is less than 1V. The above-mentioned low-voltage characteristic of the low-voltage transistor may be obtained by a specific process, for example, by lowering a threshold voltage of the low-voltage transistor, reducing a thickness of a gate oxide layer of the low-voltage transistor, etc., such that the low-voltage transistor can still work normally at a low voltage. In addition, the type of the low-voltage transistor is not restricted by the present disclosure; for example, the low-voltage transistor may also be an NMOS transistor, a PMOS transistor, or the like.

In an embodiment of the present disclosure, the low-voltage push-pull module 21 may include one or more push-pull units. Each push-pull unit includes two low-voltage transistors with opposite polarities, which are connected in series to form a push-pull voltage-mode output stage.

The output isolation module 22 includes one or more output isolation units for isolating high voltages, and each of the output isolation units is connected between an output terminal of the low-voltage push-pull module and an output terminal (Pad) of the output driving circuit. The output isolation unit is configured to be turned on when the output driving circuit works normally, and to output the intermediate signal as a target output signal of the output driving circuit. Specifically, when the output driving circuit 2 works normally, the output isolation unit is configured to be turned on, at which time, the output driving circuit 2 is connected to an external circuit, and the intermediate signal output by the push-pull units is provided to the external circuit to drive the external circuit. When the output driving circuit 2 is not in operation, the output isolation unit is configured to be turned off, at which time, the output driving circuit 2 is disconnected from the external circuit.

According to the above description, the output driving circuit of the present disclosure adopts one or more push-pull units, each including a low-voltage transistor pair, as an output structure, and provides a desired swing level to a receiving circuit without a termination resistor, which is beneficial to reducing output dynamic power consumption. In addition, the low-voltage transistor can operate with a lower power supply voltage, which is beneficial to further reducing the power consumption of the output driving circuit. Moreover, compared with the technical solution that adopts high-voltage transistors as switching transistors, since the low-voltage transistor has a smaller size and parasitic capacitance, the output driving circuit of the present disclosure has lower switching capacitor power consumption and parasitic power consumption.

Besides, the output driving circuit of the present disclosure adopts an output structure with a push-pull voltage-mode composed of a low-voltage transistor pair, which can provide a faster output signal slew rate and a faster switching speed, and is suitable for higher-speed application scenarios.

Further, when the output driving circuit is not in operation, the output isolation module is in an off state, and at this time, low-voltage transistors will not be damaged even if the output pins are working at a high-voltage mode, so that the output driving circuit of the present disclosure has high reliability.

Figure 3:
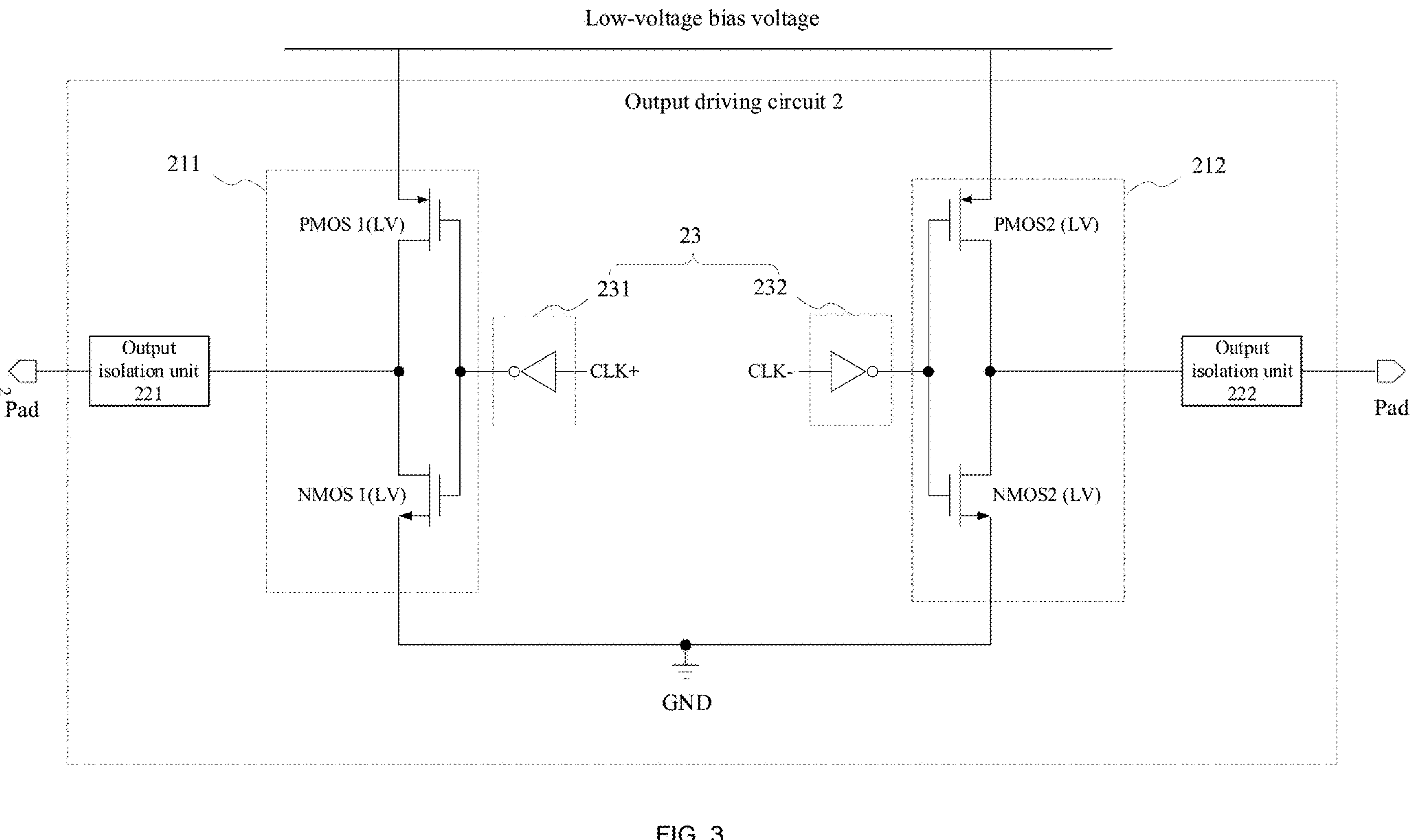
FIG. 3 shows a circuit diagram of an output driving circuit according to an embodiment of the present disclosure.

FIG. 3 shows a circuit diagram of the output driving circuit 2 according to an embodiment of the present disclosure. In FIG. 3, the low-voltage push-pull module includes two push-pull units. As shown in FIG. 3, in an embodiment of the present disclosure, the low-voltage push-pull module 21 includes a first push-pull unit 211 and a second push-pull unit 212. Each push-pull unit includes a first low-voltage transistor and a second low-voltage transistor with opposite polarities; that is, the first low-voltage transistor and the second low-voltage transistor are respectively configured as a pull-up transistor and a pull-down transistor. The first low-voltage transistor is a low-voltage PMOS transistor (i.e., PMOS1 and PMOS2 in FIG. 3), the second low-voltage transistor is a low-voltage NMOS transistor (i.e., NMOS1 and NMOS2 in FIG. 3). A source of the first low-voltage transistor is connected to a low-voltage bias voltage, a drain of the first low-voltage transistor is connected to a drain of the second low-voltage transistor, a source of the second low-voltage transistor is connected to ground, a gate of the first low-voltage transistor is connected to a gate of the second low-voltage transistor, a connection point between the gate of the first low-voltage transistor and the gate of the second low-voltage transistor is configured as an input terminal of a corresponding push-pull unit, and a connection point between the drain of the first low-voltage transistor and the drain of the second low-voltage transistor is configured as an output terminal of the corresponding push-pull unit.

It should be noted that the type and connection of transistors in push-pull units shown in FIG. 3 are only illustrative, and the present disclosure is not limited thereto. For example, in one embodiment, the first push-pull unit and/or the second push-pull unit may have a low-voltage PMOS transistor as a pull-up transistor, and have a low-voltage NMOS transistor as a pull-down transistor. In another embodiment, the first push-pull unit and/or the second push-pull unit may have a low-voltage NMOS transistor as a pull-up transistor, and have a low-voltage PMOS transistor as a pull-down transistor.

In some embodiments, the high-speed input signal input to the two push-pull units may be a pair of differential signals, such as a pair of differential high-speed clock signals. For example, in the output driving circuit 2 shown in FIG. 3, the high-speed input signal is differential clock signals CLK+ and CLK−. CLK+ is input to the first push-pull unit 211, and CLK− is input to the second push-pull unit 212.

In other embodiments, the high-speed input signal may be a single-terminal high-speed signal. At this time, the single-terminal high-speed signal can be selectively input into either one of the push-pull units; for example, the single-terminal high-speed signal is input into the first push-pull unit 211, and then is processed and output by the first push-pull unit 211.

In some embodiments, the output isolation module 22 may include two output isolation units 221, 222. The output isolation unit 221 is connected between an output terminal of the first push-pull unit 211 and a first output terminal of the output driving circuit 2, and the output isolation unit 222 is connected between an output terminal of the second push-pull unit 212 and a second output terminal of the output driving circuit 2. Both the output isolation unit 221 and the output isolation unit 222 can be configured to be turned on or off, and the output driving circuit 2 may control the connection between push-pull units 211, 212 and the external circuit by turning on or off the output isolation unit 221 and/or the output isolation unit 222.

Figure 4:
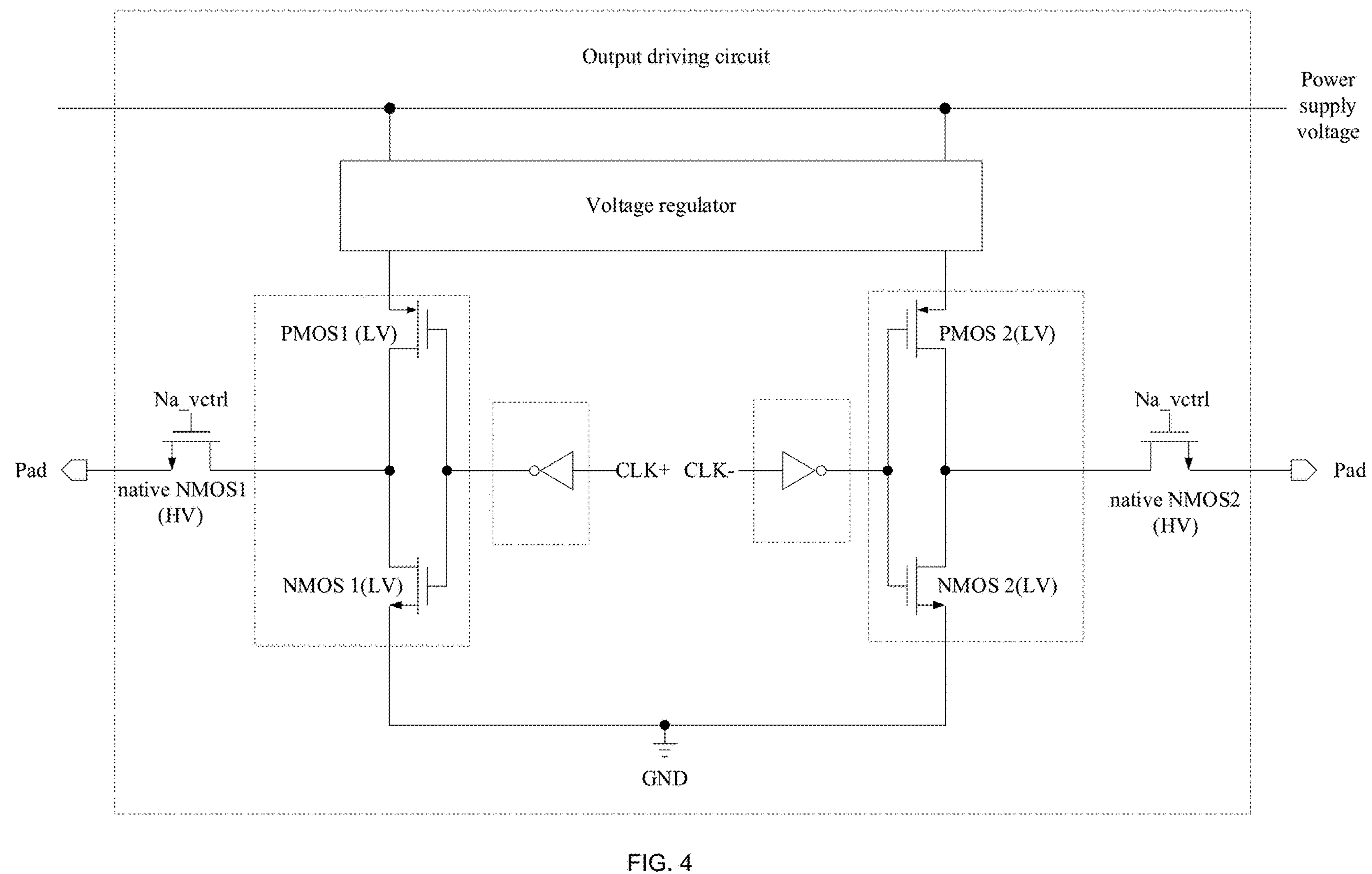
FIG. 4 shows a circuit diagram of an output driving circuit according to an embodiment of the present disclosure.

In some embodiments, the output isolation unit 221 and the output isolation unit 222 may be implemented by high-voltage transistors, such as high-voltage native MOS transistors. A high-voltage native MOS transistor requires a higher operating voltage when operating in a logic circuit, and the operating voltage of the high-voltage native MOS transistor can vary due to different applications and manufacturing processes. For example, in some embodiments, the operating voltage of the high-voltage native MOS transistors can be greater than or equal to 3.3 V. The high-voltage native MOS transistors may be high-voltage native NMOS transistors or high-voltage native PMOS transistors. In order to distinguish from the following, high-voltage transistors constituting the output isolation unit 221 and output isolation unit 222 are referred as first high-voltage transistors, and the first high-voltage transistors shown in FIG. 4 are high-voltage native NMOS transistors. As shown in FIG. 4, a drain of each high-voltage native NMOS transistor (i.e., native NMOS1 and native NMOS2 in FIG. 4) is connected to the output terminal of the corresponding push-pull unit for receiving the intermediate signal. A source of each high-voltage native NMOS transistor is connected to a corresponding output terminal of the output driving circuit, wherein the intermediate signal is output as the target output signal through the corresponding output terminal of the output driving circuit when the high-voltage native NMOS transistor is turned on. A gate of each high-voltage native NMOS transistor receives a control voltage Na_Vctrl, and each high-voltage native NMOS transistor can be turned on or off via the control voltage Na_Vctrl. For example, when the output driving circuit works normally, the gate of each high-voltage native NMOS transistor can be connected to a high-voltage signal, so that the high-voltage native NMOS1 and the high-voltage native NMOS2 are turned on; when the output driving circuit is not in operation, the gate of each high-voltage native NMOS transistor can be connected to ground, so that the high-voltage native NMOS1 and the high-voltage native NMOS2 are turned off, thereby the low-voltage transistor in the corresponding push-pull unit can be prevented from being damaged by a high voltage of the external circuit, thus avoiding reliability problems.

When the high-voltage native NMOS transistor is adopted to isolate the high voltage, an output impedance of each high-voltage native NMOS transistor has a large difference with the change in the process, voltage, and temperature. For the above problem, the embodiment of the present disclosure can include an impedance calibration module to calibrate an output impedance of the output driving circuit, so that the output impedance of the output driving circuit is constant, thereby ensuring that the output driving circuit has better signal integrity in high-speed application scenarios.

Figure 5:
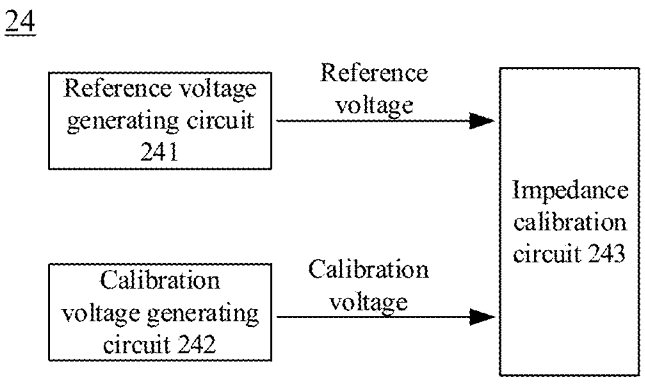
FIG. 5 shows a schematic structural diagram of an impedance calibration module according to an embodiment of the present disclosure.

FIG. 5 shows a schematic structural diagram of an impedance calibration module 24 according to an embodiment of the present disclosure. As shown in FIG. 5, the impedance calibration module 24 includes a reference voltage generating circuit 241, a calibration voltage generating circuit 242 and an impedance calibration circuit 243. Specifically, the reference voltage generating circuit 241 is configured to generate a reference voltage; for example, the reference voltage may be set to ½ of the low-voltage bias voltage. The calibration voltage generating circuit 242 is configured to generate a calibration voltage, wherein the calibration voltage is negatively correlated with the output impedance of the output driving circuit, that is, the smaller the output impedance of the output driving circuit is, the higher the calibration voltage is, and the larger the output impedance of the output driving circuit is, the lower the calibration voltage is. When the calibration voltage is equal to the reference voltage, the output impedance of the output driving circuit is equal to a target impedance. The impedance calibration circuit 243 is configured to adjust the control voltage Na_Vctrl output to a gate of a first high-voltage native NMOS transistor according to the calibration voltage and the reference voltage, thereby adjusting the output impedance of the first high-voltage native NMOS transistor (including native NMOS1 and native NMOS2). Specifically, when the calibration voltage is higher than the reference voltage, as the calibration voltage is negatively correlated with the output impedance of the output driving circuit, the output impedance of the output driving circuit is less than the target impedance. In this case, the impedance calibration circuit 243 is configured to reduce the control voltage Na_Vctrl, thereby increasing the output impedance of the first high-voltage native NMOS transistor. Similarly, when the calibration voltage is lower than the reference voltage, the output impedance of the output driving circuit is greater than the target impedance. In this case, the impedance calibration circuit 243 is configured to increase the control voltage Na_Vctrl, thereby reducing the output impedance of the first high-voltage native NMOS transistor. In summary, the impedance calibration module 24 can ensure that the output impedance of the output driving circuit is constant.

Figure 6:
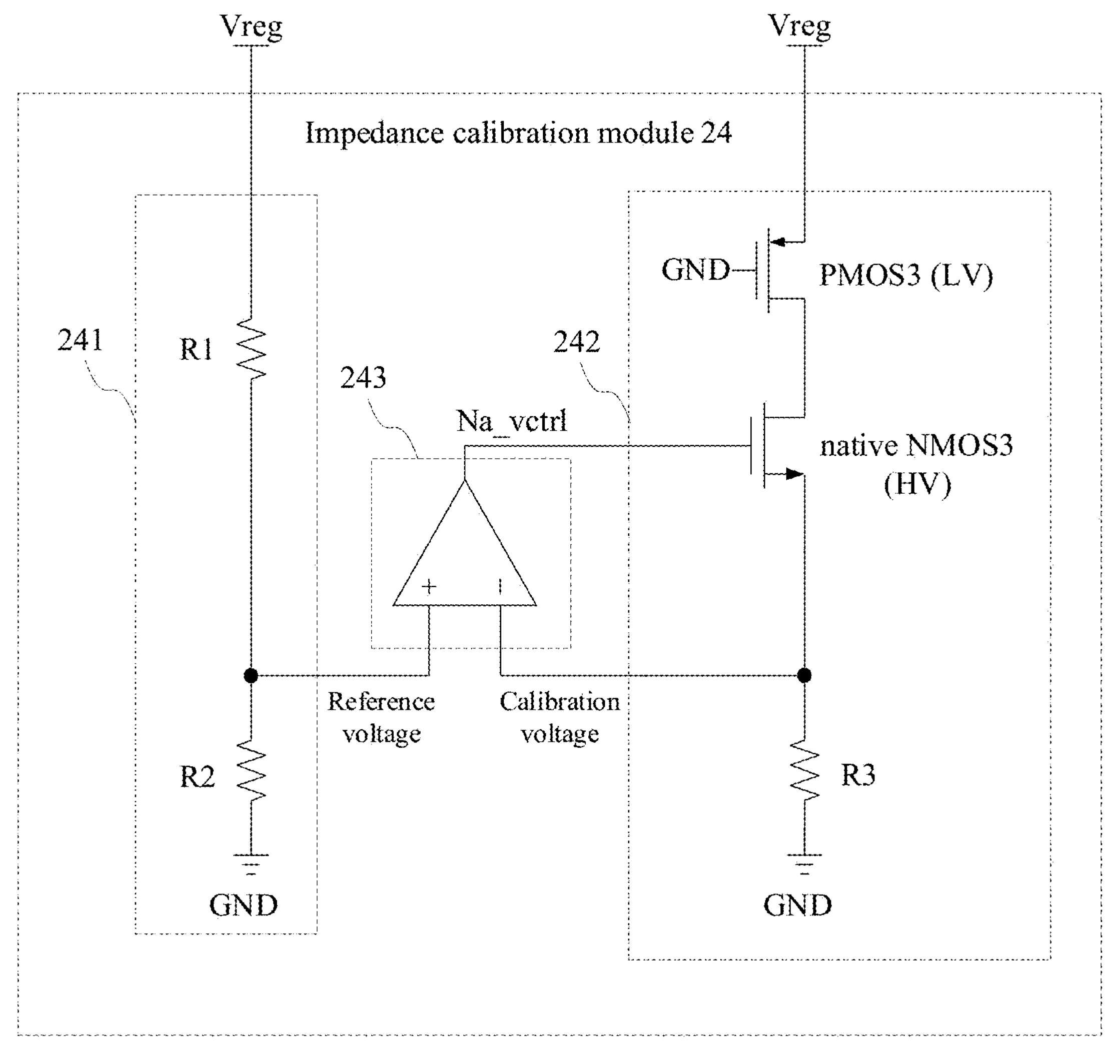
FIG. 6 shows a circuit diagram of an impedance calibration module according to an embodiment of the present disclosure.

FIG. 6 shows a circuit diagram of the impedance calibration module 24 according to an embodiment of the present disclosure. As shown in FIG. 6, the reference voltage generating circuit 241 may include a first resistor R1 and a second resistor R2. The first resistor R1 and the second resistor R2 are connected in series between the low-voltage bias voltage and ground. A connection point between the first resistor R1 and the second resistor R2 is configured as an output terminal of the reference voltage generating circuit 241 to output the reference voltage to the impedance calibration circuit 243.

In some embodiments, the first resistor R1 and the second resistor R2 have substantially the same resistance, and at this time, the reference voltage is ½ of the low-voltage bias voltage.

The calibration voltage generating circuit 242 includes a third low-voltage transistor PMOS3, a second high-voltage transistor Native NMOS3, and a third resistor R3. The third low-voltage transistor, the second high-voltage transistor and the third resistor are connected in series between the low-voltage bias voltage and ground. A connection point between the second high-voltage transistor and the third resistor is configured as an output terminal of the calibration voltage generating circuit 242 to output the calibration voltage. The second high-voltage transistor receives the control voltage output by the impedance calibration circuit 243. It may be understood that a connection structure between the third low-voltage transistor and the second high-voltage transistor simulates a pull-up circuit part in the output driving circuit, that is, a connection structure between the first low-voltage transistor and the first high-voltage transistor, and this simulating structure, along with the third resistor, divides the low-voltage bias voltage to generate the calibration voltage. The third low-voltage transistor and the first low-voltage transistor are transistors of the same type, the second high-voltage transistor and the first high-voltage transistor are transistors of the same type, and an overall size of the third low-voltage transistor and the second high-voltage transistor is 1/N of that of the first low-voltage transistor and the first high-voltage transistor; that is, an overall output impedance of the third low-voltage transistor and the second high-voltage transistor is N times that of the first low-voltage transistor and the first high-voltage transistor, where N is a ratio of a resistance of the third resistor to the target output impedance of the output driving circuit; for example, when the third resistor R3 has a resistance value of 1K ohms, and the target output impedance is 50 ohms, N is 20.

In FIG. 6, the third low-voltage transistor may be a low-voltage PMOS transistor (i.e., PMOS3), and the second high-voltage transistor may be a high-voltage native NMOS transistor (i.e., Native NMOS3). As shown in FIG. 6, a source of the PMOS3 is connected to the low-voltage bias voltage (i.e., Vreg), a gate of the PMOS3 is connected to ground, a drain of the PMOS3 is connected to a drain of the Native NMOS3, a source of the Native NMOS3 is connected to a first end of the third resistor R3, a second end of the third resistor R3 is connected to ground, a gate of the Native NMOS3 receives the control voltage (i.e., Na_vctrl) output by the impedance calibration circuit 243, and a connection point between the source of the Native NMOS3 and the first end of the third resistor R3 is configured as the output terminal of the calibration voltage generating circuit 242 to output the calibration voltage.

The impedance calibration circuit 243 includes an operational amplifier. A positive input terminal of the operational amplifier is configured to receive the reference voltage, a negative input terminal of the operational amplifier is configured to receive the calibration voltage, and the operational amplifier outputs the control voltage based on the reference voltage and the calibration voltage. In some embodiments, an output terminal of the operational amplifier is connected to the gate of the second high-voltage transistor (i.e., native NMOS3). By adjusting the control voltage (i.e., Na_vctrl) output to the gate of the Native NMOS3 (e.g., which may be adjusted between 0-3.3 V), the operational amplifier can adjust the output impedance of the Native NMOS3.

According to the above description, the operational amplifier and the native NMOS3 form a negative feedback loop, and the output impedance of the native NMOS3 can be adjusted in real time by adjusting the control voltage (i.e., Na_vctrl), so as to adjust an overall output impedance of the PMOS3 and the native NMOS3. When the overall output impedance of the PMOS3 and the native NMOS3 is adjusted to be the same as the resistance of the third resistor R3, for example, 1K ohms, the overall output impedance of the first low-voltage transistor (PMOS1, PMOS2) and the first high-voltage transistor (Native NMOS1, native NMOS2) is synchronously adjusted to be 1/20 of the overall output impedance of the PMOS3 and the native NMOS3 (with N being equal to 20), i.e., 50 ohms. In this way, the output impedance of the output driving circuit can be substantially constant, so that the output signal of the output driving circuit has better integrity in high-speed application scenarios.

In an embodiment of the present disclosure, the output driving circuit may further include one or more pre-driving modules. An output terminal of each pre-driving module is connected to a corresponding input terminal of the low-voltage push-pull module (that is, input terminals of the push-pull units) to receive the high-speed input signal and output an adjusted high-speed input signal to the low-voltage push-pull module, so as to pre-drive the low-voltage push-pull module, and the driving capability and the output speed of the output driving circuit are thus improved. In an embodiment of the present disclosure, a working voltage of the pre-driving module is the low-voltage bias voltage.

Referring to FIG. 3, in an embodiment of the present disclosure, the pre-driving module 23 includes a pre-driving unit 231 and a pre-driving unit 232. Specifically, the pre-driving unit 231 is configured to pre-drive CLK+, and the pre-driving unit 232 is configured to pre-drive CLK−. It should be noted that the structures of the pre-driving unit 231 and the pre-driving unit 232 shown in FIG. 3 are merely illustrative and exemplary.

In some embodiments, the pre-driving unit 231 and the pre-driving unit 232 are each implemented by a low-voltage control circuit operating under a low-voltage bias voltage, such as an operational amplifier.

According to the above description, in the output driving circuit of the present disclosure, push-pull units and pre-driving units may work at a low voltage (for example, 0.75 V). By this way, the overall power consumption of the output driving circuit can be further reduced. For example, when the output driving circuit of the present disclosure outputs a differential high-speed clock signal of 100 MHZ, the dynamic current loss of the output driving circuit is about only 2.2 mA.

The present disclosure further provides a clock chip, and the clock chip includes a clock signal generating circuit and an output driving circuit.

The clock signal generating circuit is configured to generate a high-speed clock signal, and a frequency of the high-speed clock signal is, for example, 100 MHz. In some embodiments, the clock signal generating circuit may adopt a crystal oscillator and a frequency multiplier to generate the high-speed clock signal. In other embodiments, the clock signal generating circuit may be a locked loop or a delay locked loop (DLL) to generate the high-speed clock signal. It should be understood that the foregoing two methods for generating the high-speed clock signal are only exemplary.

The output driving circuit includes a low-voltage push-pull module and an output isolation module, wherein the output driving circuit is configured to receive the high-speed clock signal and output a target high-speed clock signal. Specifically, the low-voltage push-pull module is connected to a low-voltage bias voltage and is configured to receive and process the high-speed clock signal, and to output an intermediate signal having a target level, wherein the low-voltage push-pull module includes one or more push-pull units, each including a low-voltage transistor pair. The output isolation module is connected between an output terminal of the low-voltage push-pull module and an output terminal of the output driving circuit, wherein the output isolation module is configured to be turned on when the output driving circuit works normally, and to output the intermediate signal as the target high-speed clock signal. The output driving circuit is configured to provide sufficient current and voltage to drive the high-speed clock signal to a target device, so as to ensure the stability and reliability of the high-speed clock signal.

The clock chip of the present disclosure may be represented as a saleable active device manufactured by packaging the clock signal generating circuit and the output driving circuit fabricated on a wafer using semiconductor technology; or as a saleable active device manufactured by packaging the clock signal generating circuit and the output driving circuit using the PCB packaging technology.

Figure 7:
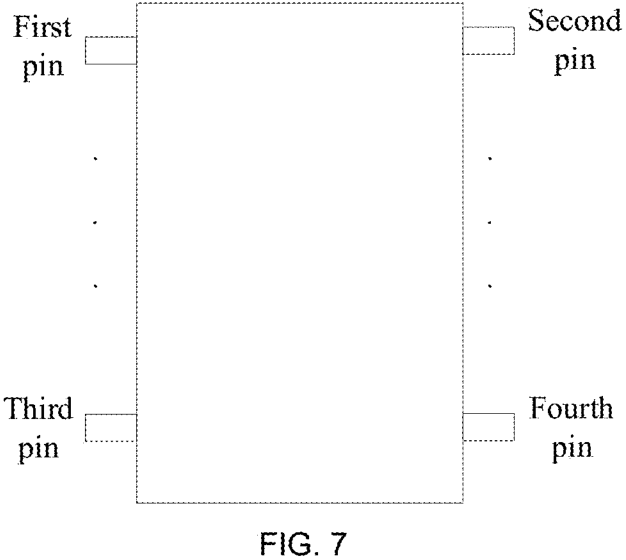
FIG. 7 shows a schematic structural diagram of a clock chip according to an embodiment of the present disclosure.

FIG. 7 shows a schematic package diagram of a clock chip according to an embodiment of the present disclosure. As shown in FIG. 7, the clock chip includes at least a first pin for receiving a high-speed clock signal, a second pin for outputting a target high-speed clock signal, a third pin for connecting to a voltage, and a fourth pin for connecting to ground.

The present disclosure further provides an electronic device, and the electronic device includes a signal generating circuit and an output driving circuit. The signal generating circuit is configured to generate a high-speed signal. The output driving circuit includes a low-voltage push-pull module and an output isolation module, wherein the output driving circuit is configured to receive the high-speed signal and output a target high-speed signal, The low-voltage push-pull module is connected to a low-voltage bias voltage and is configured to receive and process the high-speed signal, and to output an intermediate signal having a target level, wherein the low-voltage push-pull module includes one or more push-pull units, each including a low-voltage transistor pair. The output isolation module is connected between an output terminal of the low-voltage push-pull module and an output terminal of the output driving circuit, wherein the output isolation module is configured to be turned on when the output driving circuit works normally, and to output the intermediate signal as the target high-speed signal.

In summer, compared with conventional HCSL output driving circuits, the output driving circuit of the present disclosure can work with a lower power supply voltage (0.75 V), adopts an output structure with a voltage-mode, and provides a desired swing level to a receiving circuit without using termination resistors, which is beneficial to reducing output dynamic power consumption. Besides, the output driving circuit of the present disclosure adopts an output structure with a push-pull voltage-mode composed of low-voltage transistors, which can provide a faster output signal slew rate, and is suitable for higher-speed application scenarios. Compared with existing low-power-consumption output driving circuits, the output driving circuit of the present disclosure adopts a low-voltage transistor as an output stage device, provides a faster switching speed, and is suitable for higher-speed application scenarios. Compared with using a high-voltage transistor as a switching transistor, the low-voltage transistor has a smaller size and parasitic capacitance, and thus the output driving circuit of the present disclosure has lower switching capacitor power consumption and parasitic power consumption. Meanwhile, the pre-driving circuit of the low-voltage transistor is also implemented by using a low-voltage control circuit, thereby allowing the overall dynamic power consumption of the output driving circuit to be further reduced. Further, the output driving circuit of the present disclosure adopts the high-voltage Native NMOS transistor as an isolation device, which can not only protect low-voltage devices and avoid reliability problems, but also ensure that the output impedance of the output driving circuit is substantially constant through the adaptive impedance calibration circuit including the high-voltage Native NMOS transistor, thereby ensuring that the output signal has better integrity in high-speed application scenarios.

Therefore, the present disclosure effectively overcomes various shortcomings of the prior art and has a high industrial value.

The above-mentioned embodiments only exemplarily illustrate the principles and effects of the present disclosure. Any person skilled in the art may modify or change the above embodiments without violating the spirit and scope of the present disclosure. Therefore, all equivalent modifications or changes made by those skilled in the art without departing from the spirit and technical concepts disclosed by the present disclosure should still be covered by the attached claims of the present disclosure.

What is claimed is:

1. An output driving circuit, including a low-voltage push-pull module, an impedance calibration module, and an output isolation module, wherein the low-voltage push-pull module is connected to a low-voltage bias voltage and is configured to receive and process a high-speed input signal, and to output an intermediate signal having a target level, wherein the low-voltage push-pull module includes one or more push-pull units, each including a low-voltage transistor pair including a first low-voltage transistor, wherein the output isolation module is connected between an output terminal of the low-voltage push-pull module and an output terminal of the output driving circuit, and includes output isolation units each including a first high-voltage transistor, wherein the output isolation module is configured to be turned on when the output driving circuit works normally, and to output the intermediate signal as a target output signal of the output driving circuit, wherein the impedance calibration module is configured to calibrate an output impedance of the output driving circuit, so that the output impedance of the output driving circuit is substantially constant; the impedance calibration module includes: a reference voltage generating circuit configured to generate a reference voltage; a calibration voltage generating circuit configured to generate a calibration voltage negatively correlated with the output impedance; and an impedance calibration circuit configured to adjust a control voltage according to the reference voltage and the calibration voltage;

wherein the calibration voltage generating circuit includes a third low-voltage transistor, a second high-voltage transistor, and a third resistor connected in series between the low-voltage bias voltage and ground; a connection point between the second high-voltage transistor and the third resistor outputs the calibration voltage, and the second high-voltage transistor receives the control voltage output by the impedance calibration circuit, wherein the third low-voltage transistor and the first low-voltage transistor are of the same type, the second high-voltage transistor and the first high-voltage transistor are of the same type, an overall size of the third low-voltage transistor and the second high-voltage transistor is 1/N of that of the first low-voltage transistor and the first high-voltage transistor, and a ratio of a resistance of the third resistor to N is a target output impedance of the output driving circuit.

2. The output driving circuit according to claim 1, wherein the low-voltage push-pull module includes two push-pull units, and the two push-pull units receive a pair of differential signals.

3. The output driving circuit according to claim 1, wherein each of the push-pull units includes the first low-voltage transistor and a second low-voltage transistor with opposite polarities, and the first low-voltage transistor and the second low-voltage transistor are connected in series between the low-voltage bias voltage and ground.

4. The output driving circuit according to claim 3, wherein the first low-voltage transistor is a low-voltage PMOS transistor, and the second low-voltage transistor is a low-voltage NMOS transistor.

5. The output driving circuit according to claim 4, wherein a source of the first low-voltage transistor is connected to the low-voltage bias voltage, a drain of the first low-voltage transistor is connected to a drain of the second low-voltage transistor, a source of the second low-voltage transistor is connected to ground, a gate of the first low-voltage transistor is connected to a gate of the second low-voltage transistor, a connection point between the gate of the first low-voltage transistor and the gate of the second low-voltage transistor is configured as an input terminal of the corresponding push-pull unit, and a connection point between the drain of the first low-voltage transistor and the drain of the second low-voltage transistor is configured as the output terminal of the corresponding push-pull unit.

6. The output driving circuit according to claim 3, wherein the output isolation units are in one-to-one correspondence with the one or more push-pull units, wherein:

a drain of the first high-voltage transistor is connected to an output terminal of a corresponding push-pull unit and is configured to receive the intermediate signal;

a gate of the first high-voltage transistor receives the control voltage, wherein the control voltage turns on or off the first high-voltage transistor;

a source of the first high-voltage transistor is connected to the output terminal of the output driving circuit, wherein the intermediate signal is output as the target output signal via the output terminal of the output driving circuit when the first high-voltage transistor is turned on.

7. The output driving circuit according to claim 6, wherein the first high-voltage transistor is a native NMOS transistor.

8. The output driving circuit according to claim 1, wherein the reference voltage generating circuit includes a first resistor and a second resistor, the first resistor and the second resistor are connected in series between the low-voltage bias voltage and ground, and a connection point between the first resistor and the second resistor is configured as an output terminal of the reference voltage generating circuit to output the reference voltage.

9. The output driving circuit according to claim 8, wherein the first resistor and the second resistor have substantially the same resistance.

10. The output driving circuit according to claim 1, wherein the third low-voltage transistor is a low-voltage PMOS transistor, and the second high-voltage transistor is a high-voltage native NMOS transistor.

11. The output driving circuit according to claim 10, wherein a source of the third low-voltage transistor is connected to the low-voltage bias voltage, a drain of the third low-voltage transistor is connected to a drain of the second high-voltage transistor, a gate of the third low-voltage transistor is connected to ground, a source of the second high-voltage transistor is connected to a first end of the third resistor, a second end of the third resistor is connected to ground, a gate of the second high-voltage transistor receives the control voltage output by the impedance calibration circuit, and a connection point between the source of the second high-voltage transistor and the first end of the third resistor is configured as an output terminal of the calibration voltage generating circuit to output the calibration voltage.

12. The output driving circuit according to claim 1, wherein the impedance calibration circuit includes an operational amplifier, a positive input terminal of the operational amplifier is configured to receive the reference voltage, a negative input terminal of the operational amplifier is configured to receive the calibration voltage, and the operational amplifier outputs the control voltage based on the reference voltage and the calibration voltage.

13. The output driving circuit according to claim 1, wherein the output driving circuit further includes a voltage regulator, and the voltage regulator is configured to buck a power supply voltage to output the low-voltage bias voltage.

14. The output driving circuit according to claim 1, wherein the output driving circuit further includes one or more pre-driving modules, and each of the pre-driving modules is connected to a corresponding input terminal of the low-voltage push-pull module to pre-drive the high-speed input signal, wherein a working voltage of the pre-driving module is the low-voltage bias voltage.

15. The output driving circuit according to claim 1, wherein the low-voltage bias voltage is about 0.75 V.

16. A clock chip, including:

a clock signal generating circuit, configured to generate a high-speed clock signal; and an output driving circuit, including a low-voltage push-pull module, an impedance calibration module, and an output isolation module, wherein the output driving circuit is configured to input the high-speed clock signal and output a target high-speed clock signal, wherein the low-voltage push-pull module is connected to a low-voltage bias voltage and is configured to receive and process the high-speed clock signal, and to output an intermediate signal having a target level, wherein the low-voltage push-pull module includes one or more push-pull units, each including a low-voltage transistor pair including a first low-voltage transistor, wherein the output isolation module is connected between an output terminal of the low-voltage push-pull module and an output terminal of the output driving circuit, and includes output isolation units each including a first high-voltage transistor, wherein the output isolation module is configured to be turned on when the output driving circuit works normally, and to output the intermediate signal as the target high-speed clock signal, wherein the impedance calibration module is configured to calibrate an output impedance of the output driving circuit, so that the output impedance of the output driving circuit is substantially constant; the impedance calibration module includes: a reference voltage generating circuit configured to generate a reference voltage; a calibration voltage generating circuit configured to generate a calibration voltage negatively correlated with the output impedance; and an impedance calibration circuit configured to adjust a control voltage according to the reference voltage and the calibration voltage;

wherein the calibration voltage generating circuit includes a third low-voltage transistor, a second high-voltage transistor, and a third resistor connected in series between the low-voltage bias voltage and ground; a connection point between the second high-voltage transistor and the third resistor outputs the calibration voltage, and the second high-voltage transistor receives the control voltage output by the impedance calibration circuit, wherein the third low-voltage transistor and the first low-voltage transistor are of the same type, the second high-voltage transistor and the first high-voltage transistor are of the same type, an overall size of the third low-voltage transistor and the second high-voltage transistor is 1/N of that of the first low-voltage transistor and the first high-voltage transistor, and a ratio of a resistance of the third resistor to N is a target output impedance of the output driving circuit.

17. An electronic device, including:

a signal generating circuit, configured to generate a high-speed signal; and an output driving circuit, including a low-voltage push-pull module, an impedance calibration module, and an output isolation module, wherein the output driving circuit is configured to input the high-speed signal and output a target high-speed signal, wherein the low-voltage push-pull module is connected to a low-voltage bias voltage and is configured to receive and process the high-speed signal, and to output an intermediate signal having a target level, wherein the low-voltage push-pull module includes one or more push-pull units, each including a low-voltage transistor pair including a first low-voltage transistor, wherein the output isolation module is connected between an output terminal of the low-voltage push-pull module and an output terminal of the output driving circuit, and includes output isolation units each including a first high-voltage transistor, wherein the output isolation module is configured to be turned on when the output driving circuit works normally, and to output the intermediate signal as the target high-speed signal, wherein the impedance calibration module is configured to calibrate an output impedance of the output driving circuit, so that the output impedance of the output driving circuit is substantially constant; the impedance calibration module includes: a reference voltage generating circuit configured to generate a reference voltage; a calibration voltage generating circuit configured to generate a calibration voltage negatively correlated with the output impedance; and an impedance calibration circuit configured to adjust a control voltage according to the reference voltage and the calibration voltage;

wherein the calibration voltage generating circuit includes a third low-voltage transistor, a second high-voltage transistor, and a third resistor connected in series between the low-voltage bias voltage and ground; a connection point between the second high-voltage transistor and the third resistor outputs the calibration voltage, and the second high-voltage transistor receives the control voltage output by the impedance calibration circuit, wherein the third low-voltage transistor and the first low-voltage transistor are of the same type, the second high-voltage transistor and the first high-voltage transistor are of the same type, an overall size of the third low-voltage transistor and the second high-voltage transistor is 1/N of that of the first low-voltage transistor and the first high-voltage transistor, and a ratio of a resistance of the third resistor to N is a target output impedance of the output driving circuit.

* * * * *